US012265110B2

(12) United States Patent
Itami et al.

(10) Patent No.: US 12,265,110 B2
(45) Date of Patent: Apr. 1, 2025

(54) HIGH-FREQUENCY ANTENNA MEASUREMENT SYSTEM

(71) Applicant: Nippon Telegraph and Telephone Corporation, Tokyo (JP)

(72) Inventors: Go Itami, Tokyo (JP); Hiroshi Hamada, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 152 days.

(21) Appl. No.: 18/247,032

(22) PCT Filed: Nov. 4, 2020

(86) PCT No.: PCT/JP2020/041168
§ 371 (c)(1),
(2) Date: Mar. 28, 2023

(87) PCT Pub. No.: WO2022/097192
PCT Pub. Date: May 12, 2022

(65) Prior Publication Data

US 2023/0358796 A1 Nov. 9, 2023

(51) Int. Cl.
*G01R 29/10* (2006.01)
*G01R 29/08* (2006.01)
(Continued)

(52) U.S. Cl.
CPC ......... *G01R 29/10* (2013.01); *G01R 29/0871* (2013.01); *G01S 17/08* (2013.01); *H01Q 1/2283* (2013.01); *H01Q 1/50* (2013.01)

(58) Field of Classification Search
CPC ...................................................... G01R 31/00
See application file for complete search history.

(56) References Cited

U.S. PATENT DOCUMENTS 10,863,371 B2 * 12/2020 Abadie ................. H04W 24/02
2010/0171669 A1 7/2010 Ito et al.
(Continued)

FOREIGN PATENT DOCUMENTS

JP 2010159990 A 7/2010

OTHER PUBLICATIONS

Dyck et al., "A Transmitter System-in-Package at 300 GHz with an Off-Chip Antenna and GaAs-Based MMICs", IEEE Transactions on Terahertz Science and Technology, vol. 9, No. 3, May 2019, pp. 335-344. As discussed in specification.
(Continued)

*Primary Examiner* — Tung X Nguyen
(74) *Attorney, Agent, or Firm* — Slater Matsil, LLP

(57) ABSTRACT

A radio frequency antenna measurement system (10) of the present invention includes a receiving antenna (14) that receives a radiated radio wave from an on-chip radio frequency antenna (AUT). The receiving antenna (14) includes a waveguide (14A) in which a connector (14B) for outputting a reception signal to the power sensor (15) is integrally formed at a rear end. Accordingly, in a state where a microscope (MS) necessary for position adjustment of a feed probe (12) is installed, it is possible to construct a reception system that receives the radiated radio wave from the AUT and measures a radiation characteristic on a stage (11), and to measure the radiation characteristic such as a gain and radiation pattern of the AUT with high accuracy.

18 Claims, 5 Drawing Sheets

(51) Int. Cl.
*G01S 17/08* (2006.01)
*H01Q 1/22* (2006.01)
*H01Q 1/50* (2006.01)

(56) References Cited

U.S. PATENT DOCUMENTS

2014/0104092 A1 4/2014 Burnett et al.
2016/0380652 A1* 12/2016 Anthony ............. H04W 52/283 375/295
2018/0205821 A1 7/2018 Rowell et al.
2021/0036724 A1* 2/2021 Lam ..................... H03G 3/3042

OTHER PUBLICATIONS

Hau et al. “High Efficiency, Wide Dynamic Range Variable Gain and Power Amplifier MMICs for Wide-Band CDMA Handsets” IEEE Microwave and Wireless Components Letters, vol. 11, No. 1, Jan. 2001, pp. 13-15. As discussed in the specification.

* cited by examiner

MICROSCOPE
MS
10
12
FEED PROBE
DETECTION PROBE
13
AUT
STAGE
11
14
14A
14B
15
POWER SENSOR
AS
ANALYSIS SYSTEM
NA
NETWORK ANALYZER
Port1
EX1
EXTENDER MICROSCOPE
MS
14
14A
14D
14C
16
15
POWER SENSOR
O
DETECTION PROBE
13
AUT
STAGE
11
FEED PROBE
12
10
AS
ANALYSIS SYSTEM
NA
NETWORK ANALYZER
Port1
EX1
EXTENDER MICROSCOPE
MS
POWER SENSOR
15
18
17
14
14A
14B
DETECTION PROBE
13
H
AUT
STAGE
11
FEED PROBE
12
10
AS
ANALYSIS SYSTEM
NETWORK ANALYZER
NA
Port1
EX1
EXTENDER

HIGH-FREQUENCY ANTENNA MEASUREMENT SYSTEM

CROSS-REFERENCE TO RELATED APPLICATIONS

This application is a national phase entry of PCT Application No. PCT/JP2020/041168, filed on Nov. 4, 2020, which application is hereby incorporated herein by reference.

TECHNICAL FIELD

The present invention relates to a radio frequency antenna measurement technique for measuring radiation characteristics related to an on-chip radio frequency antenna in an ultra-high frequency band.

BACKGROUND

There is a strong demand for wireless communication device such as mobile terminals to have the properties of being large in capacity, small in size, and easy to carry. In order to realize this, it is important to widen the band and reduce the size of a radio frequency electronic circuit (hereinafter referred to as an RF circuit) that serves as a radio frequency (RF) front-end unit of a wireless communication device built into a terminal, and of a radio frequency antenna that leads to a high data rate.

The bandwidth of the RF front end is determined by the operation bandwidth of an analog circuit such as an amplifier or a frequency converter and a radio frequency component such as a radio frequency antenna which are components thereof. The operating bandwidth of these radio frequency components is assumed to have a constant ratio of the operating band to the center frequency (referred to as a specific band) (see, for example, Non Patent Literature 1). Therefore, by increasing a carrier frequency, the operation bandwidth of the radio frequency component can be increased. In addition, when the carrier frequency is increased, a wavelength of the radio signal is shortened, and thus, it is possible to downsize the components including an impedance element (such as a quarter wavelength line) determined by the wavelength of the analog circuit or the radio frequency antenna. Therefore, increasing the carrier frequency is an effective method as a means for meeting the needs such as increasing the data rate and reducing the size of the wireless communication device.

CITATION LIST

Non Patent Literature

Non Patent Literature 1: G. Hau, T. B. Nishimura and N. Iwata, “High Efficiency, Wide Dynamic Range Variable Gain and Power Amplifier MMICs for Wide-Band CDMA Handsets”, IEEE Microw. Wireless Comp. Lett., Vol. 11, pp. 13-15, January 2001.

Non Patent Literature 2: A. Dyck, M. Rosch, A. Tessman, A. Leuther, M. Kuri, S. Wagner, B. Gashi, J. Schafer and O. Ambacher, “A Transmitter System-in-Package at 300 GHz With an Off-Chip Antenna and GaAs-Based MMICs”, IEEE Trans. Terahertz Sci. Technol, Vol. 9, pp. 335-344, May 2019.

SUMMARY

Technical Problem

In recent years, from the viewpoint described above, research on high-speed and small wireless communication devices using ultra-high frequencies such as millimeter waves and terahertz (THz) waves has been actively conducted. A problem in development of an RF circuit or a radio frequency antenna using a millimeter wave or a terahertz wave is construction of a measurement environment for performing appropriate characteristic evaluation. Since the wavelength is 1/10 to 1/100 in size as compared with the microwave band, the frequency conversion loss by an extender is large, the loss during signal transmission is very large, and it is difficult to secure the output. In addition, since the RF circuit and the radio frequency antenna are often mounted in a square size of a mm order or less, it is difficult to visually check at the time of measurement, and measurement using a precision instrument having high measurement resolution is required from the viewpoint of reproducibility (see, for example, Non Patent Literature 2).

When such an on-chip radio frequency antenna in the ultra-high frequency band is used as a measurement target antenna (Antenna Under Test (AUT), hereinafter referred to as an AUT) and its radiation characteristics are measured, it is necessary to align a feed probe that feeds a radio frequency signal to the AUT with a microscope. However, using the microscope makes it difficult to install a receiving antenna for receiving a radiated radio wave from the AUT, and measurement and evaluation of the radiation characteristics cannot be appropriately performed. In addition, even in a state where the receiving antenna can be installed, it is difficult to accurately ascertain the distance from the AUT to the receiving antenna in a um order. Furthermore, even in the case of using a microscope, it is difficult to align the horizontal reception position of the receiving antenna with the radiation center point (two-dimensional space in the horizontal direction) of the AUT, and the gain of the AUT cannot be appropriately measured. Therefore, according to the related art, there is a problem that radiation characteristics such as gain and radiation patterns regarding an on-chip radio frequency antenna in an ultra-high frequency band cannot be appropriately measured with high accuracy.

Embodiments of the present invention are intended to solve such a problem, and an object of embodiments of the present invention is to provide a radio frequency antenna measurement technique capable of appropriately measuring radiation characteristics such as gain and radiation patterns regarding an on-chip radio frequency antenna in an ultra-high frequency band with high accuracy.

Solution to Problem

In order to achieve such an object, according to embodiments of the present invention, there is provided a radio frequency antenna measurement system including: a stage that holds an on-chip radio frequency antenna to be measured; a feed probe that feeds an input radio frequency signal to the radio frequency antenna; a receiving antenna that receives a radiated radio wave from the radio frequency antenna; and a power sensor that measures a radiation characteristic of the radio frequency antenna on the basis of a reception signal output from the receiving antenna, in which the receiving antenna includes a waveguide in which a connector for outputting the reception signal to the power sensor is integrally formed at a rear end.

Advantageous Effects of Embodiments of Invention

According to embodiments of the present invention, it is possible to appropriately measure radiation characteristics such as gain and radiation patterns regarding an on-chip radio frequency antenna in an ultra-high frequency band with high accuracy.

DETAILED DESCRIPTION OF ILLUSTRATIVE EMBODIMENTS

Embodiments of the present invention will be described below with reference to the drawings.

First Embodiment

Figure 1:
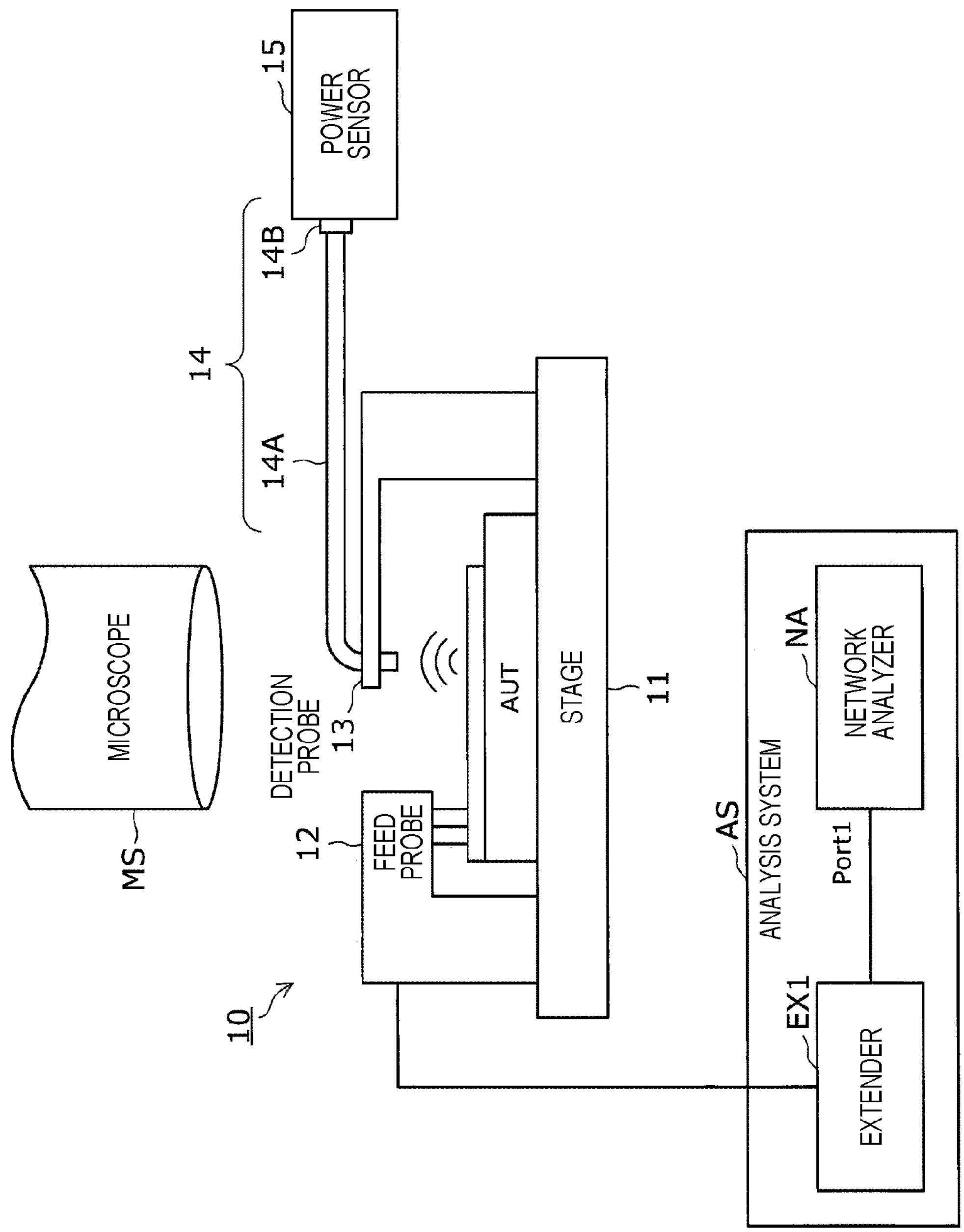
FIG. 1 is an explanatory diagram illustrating a configuration of a radio frequency antenna measurement system according to a first embodiment.

First, a radio frequency antenna measurement system 10 according to a first embodiment of the present invention will be described with reference to FIG. 1. FIG. 1 is an explanatory diagram illustrating a configuration of the radio frequency antenna measurement system according to the first embodiment.

The radio frequency antenna measurement system 10 is configured to input a radio frequency signal to an on-chip radio frequency antenna (Antenna Under Test (AUT), hereinafter referred to as an AUT) to be measured, such as an ultra-high frequency band on-chip antenna, for example, and to measure a radiation characteristic of the AUT on the basis of a reception signal obtained by receiving a radiated radio wave (radiated electromagnetic field) radiated from the AUT.

As illustrated in FIG. 1, the radio frequency antenna measurement system 10 includes, as main components, a stage 11 for holding and adjusting the position of the AUT, a feed probe (Tx Probe) 12 for feeding a radio frequency signal output from an analysis system AS to the AUT, a receiving antenna (Rx ANT) 14 for receiving a radiated radio wave from the AUT, and a power sensor 15 for detecting a radiation characteristic of the AUT from a reception signal obtained by the receiving antenna 14.

Among them, the analysis system AS and a microscope MS are general systems used in a well-known RF circuit measurement system 50 and the like, which will be described later with reference to FIG. 2. In particular, the analysis system AS uses only one port (Port1) of a general network analyzer NA, increases a band of a radio frequency signal output from the port with an extender EX1, and then feeds the radio frequency signal to the AUT via the feed probe 12. In addition, the microscope MS is used to optically check the position of the receiving antenna 14.

The feed probe 12 includes a pillar portion erected on the stage 11, an arm portion formed so as to protrude from an upper end of the pillar portion toward an upper side of the AUT, and a plurality of pins attached downward from the arm portion and in electrical contact with a power supply terminal on a surface of the AUT.

A detection probe (Rx-Probe) 13 is an existing one used in the RF circuit measurement system 50, and is not used for detecting the radiation characteristics of the AUT. Note that the detection probe 13 may be used as a support portion that supports the receiving antenna 14. In addition, as in the well-known RF circuit measurement system 50 to be described later with reference to FIG. 2, the detection probe 13 may be provided with a configuration similar to that of the feed probe 12 to detect a radio frequency signal propagating through a transmission path on the surface of the AUT and measure transmission characteristics of the AUT.

Figure 2:
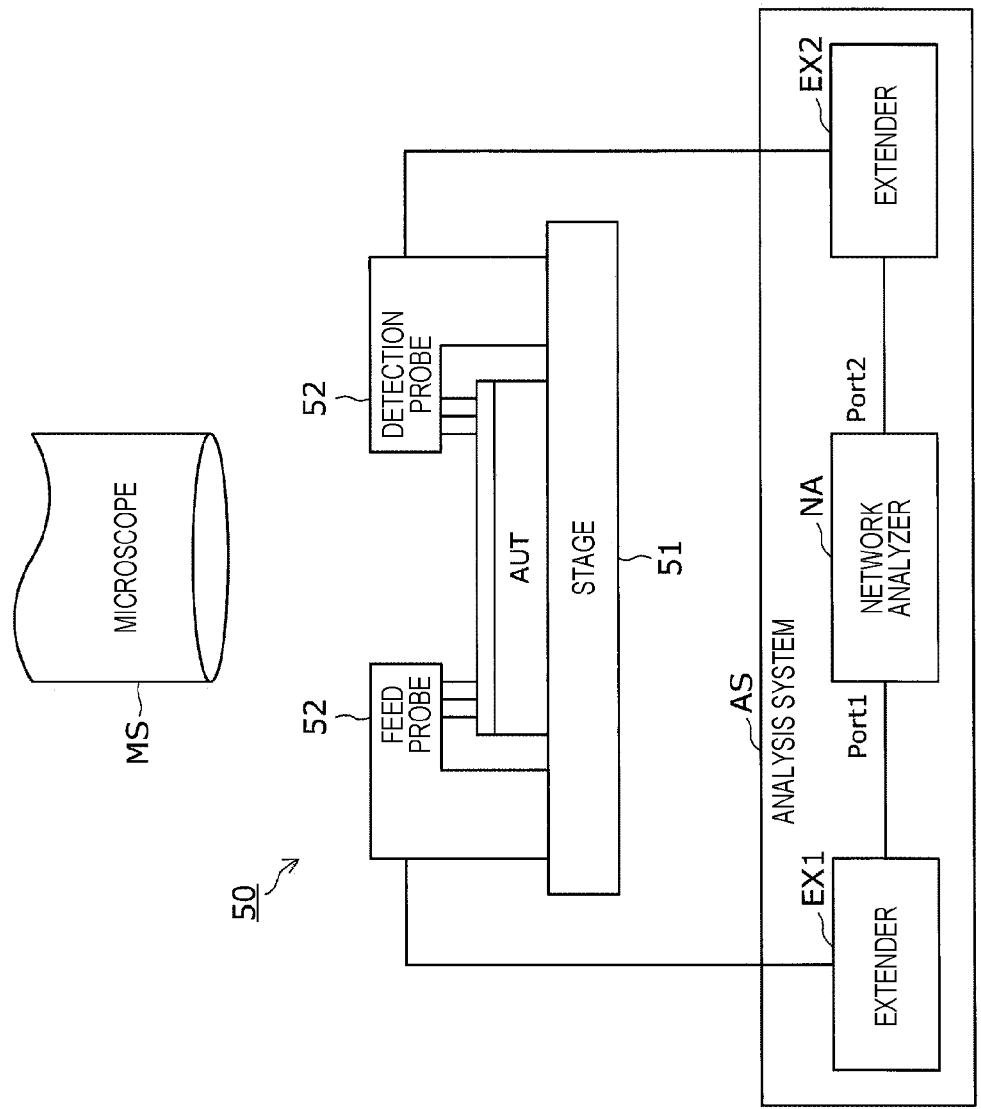
FIG. 2 is a block diagram illustrating a configuration of an RF circuit measurement system that measures transmission characteristics of an RF circuit.

FIG. 2 is a block diagram illustrating a configuration of an RF circuit measurement system that measures transmission characteristics of an RF circuit. In general, the well-known RF circuit measurement system 50 as illustrated in FIG. 2 is used when the transmission characteristics of an RF circuit (Device Under Test (DUT), hereinafter referred to as a DUT) in an ultra-high frequency band of millimeter waves or more are directly measured without packaging. The RF circuit measurement system 50 feeds a radio frequency signal output from the analysis system AS to a DUT on a stage 51 using a feed probe (Tx Probe) 52, and electrically contacts a circuit wiring of the DUT to detect the radio frequency signal by a detection probe (Rx Probe) 53 and output the radio frequency signal to the RF circuit measurement system 50.

The analysis system AS increases a band of a signal output from one port (Port1) of the network analyzer NA with the extender EX1, and then feeds the signal to the DUT via the feed probe 52 of the RF circuit measurement system 50. In addition, after the band of the radio frequency signal detected by the detection probe 53 is reduced by an extender EX2, the transmission characteristic of the DUT is measured by performing signal analysis on the other port (Port2) of the network analyzer NA.

At this time, in the RF circuit measurement system 50, it is necessary to adjust the positions of the feed probe 52 and the detection probe 53 to make electrical contact with the circuit wiring to be measured formed on the surface of the DUT. In particular, when the circuit size of the DUT is on the mm order or less, a precise probe operation with a granularity of about um using the stage 51 is required. Therefore, measurement is generally performed by probe operation using the microscope MS as illustrated in FIG. 2.

However, in the radio frequency antenna measurement system 10, the radiated radio wave from the AUT including the on-chip antenna is received by the receiving antenna 14 and measured by the power sensor 15. Therefore, in the reception system that receives the radiated radio wave from the AUT, it is necessary to hold the position of the receiving antenna 14 at a sufficient height position from the AUT. On the other hand, in the feeding system that feeds the radio frequency signal to the AUT, as described above, it is necessary to adjust the position of the feed probe 12 at the stage 11 using the microscope MS. Therefore, a mechanism capable of appropriately receiving the radiated radio wave from the AUT by the receiving antenna 14 in a state where the microscope MS is installed is required.

In the present embodiment, as illustrated in FIG. 1, the above problem has been solved by using a connector-integrated waveguide antenna as the receiving antenna 14. That is, the receiving antenna 14 includes a general waveguide 14A as a whole, and may be configured with a size adapted to the high frequency band of the AUT similarly to the reception system including the existing detection probe 13. Thereby, the radiated radio wave can be received with a relatively high gain.

Furthermore, a connector 14B for connecting to the power sensor 15 and outputting a reception signal to the power sensor 15 is integrally formed at the rear end of the receiving antenna 14. Thereby, the reception signal received by the receiving antenna 14 can be transmitted to the power sensor 15 without changing the transmission mode as the waveguide 14A, and the transmission loss to the power sensor 15 can be reduced. Furthermore, since the position of the receiving antenna 14 can also be adjusted at the stage 11 similarly to the existing detection probe 13, it is possible to measure the radiation position of the AUT with high accuracy.

Effects of First Embodiment

In this way, in the present embodiment, the receiving antenna 14 that receives the radiated radio wave from the radio frequency antenna is provided, and the receiving antenna 14 is configured by the waveguide in which the connector 14B for outputting the reception signal to the power sensor 15 is integrally formed at the rear end.

Accordingly, in a state where the microscope MS necessary for position adjustment of the feed probe 12 is installed, it is possible to construct a reception system that receives the radiated radio wave from the AUT and to measure a radiation characteristic on the stage 11. Therefore, it is possible to appropriately measure radiation characteristics such as gain and radiation patterns regarding an on-chip radio frequency antenna in an ultra-high frequency band with high accuracy.

In addition, since the receiving antenna 14 has a high-gain and low-loss structure, it can be sufficiently measured without covering the power supplied from the network analyzer NA with a power amplifier or the like, and a measurement system can be realized at relatively low cost. Therefore, it is possible to construct an antenna measurement system that measures the radiation characteristics of the on-chip radio frequency antenna only by changing a part of the reception side of the RF circuit measurement system in the related art. Therefore, it is possible to measure the radiation characteristics of the on-chip radio frequency antenna without constructing the antenna measurement system from scratch in an environment different from the RF circuit measurement system as in the related art, and it is possible to greatly shorten the time and effort of measurement of the RF front end system.

Figure 3:
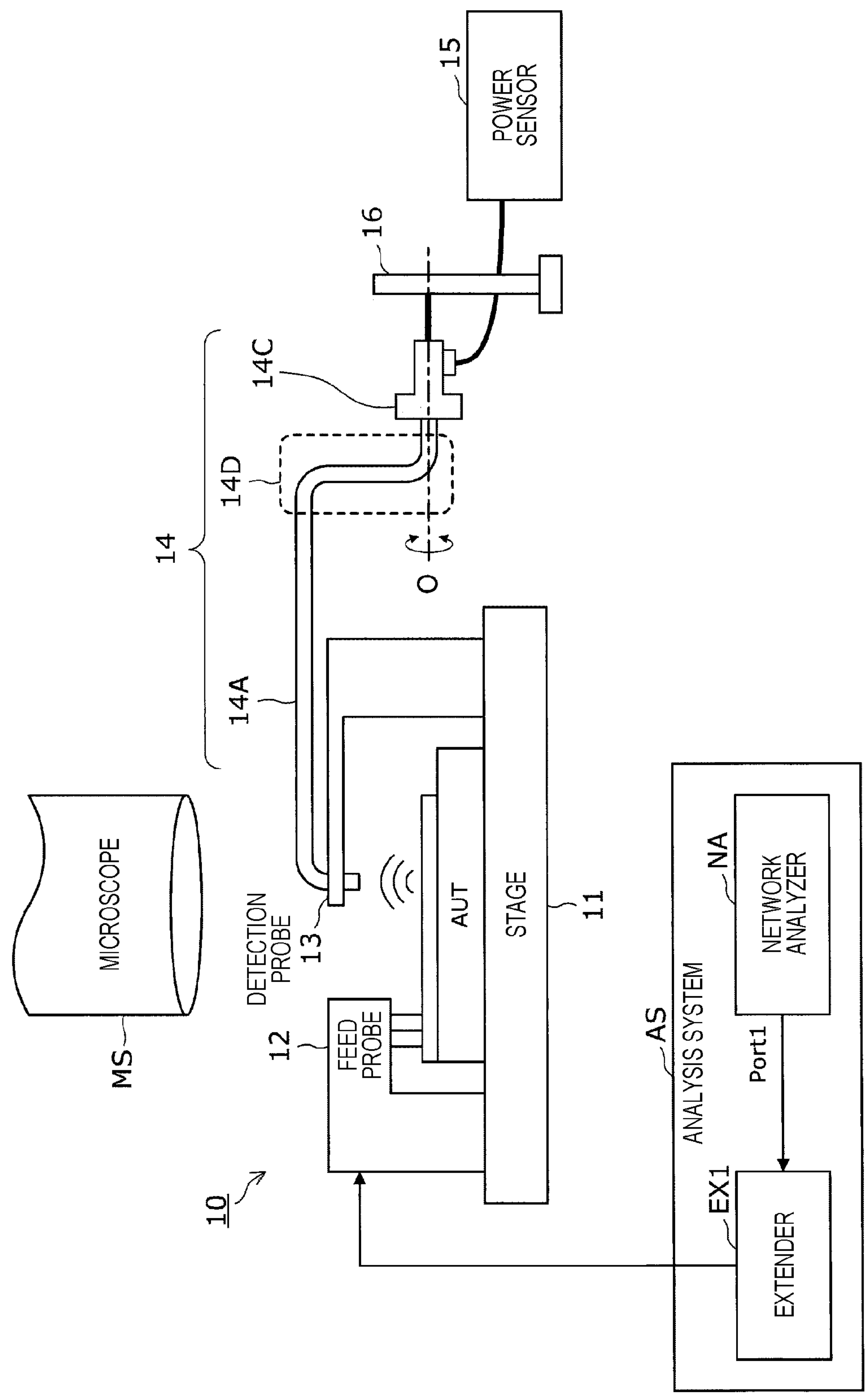
FIG. 3 is an explanatory diagram illustrating another configuration of the radio frequency antenna measurement system according to the first embodiment.

Furthermore, in the present embodiment, as illustrated in FIG. 3, for the receiving antenna 14, a waveguide-coaxial conversion adapter 14C that converts and connects the waveguide 14A to a coaxial cable 15A of the power sensor 15 may be used as the connector 14B. FIG. 3 is an explanatory diagram illustrating another configuration of the radio frequency antenna measurement system according to the first embodiment. At this time, a curved portion 14D having, for example, an S shape may be formed in the vicinity of the waveguide-coaxial conversion adapter 14C in the receiving antenna 14 (waveguide 14A), and a position where the radiated radio wave is received may be held by a holding stand 16 so as to be changeable about a central axis O of the waveguide-coaxial conversion adapter 14C.

Thereby, the position where the radiated radio wave is received by the receiving antenna 14 can be three-dimensionally changed (rotated) about the central axis O of the waveguide-coaxial adapter 13C, and the spatial radiation pattern of the AUT can be measured. It is also possible to measure the other radiation surface (unmeasured one of plane E and plane H) by inclining the disposition of the feeding system including the AUT by 90 degrees.

Second Embodiment

Figure 4:
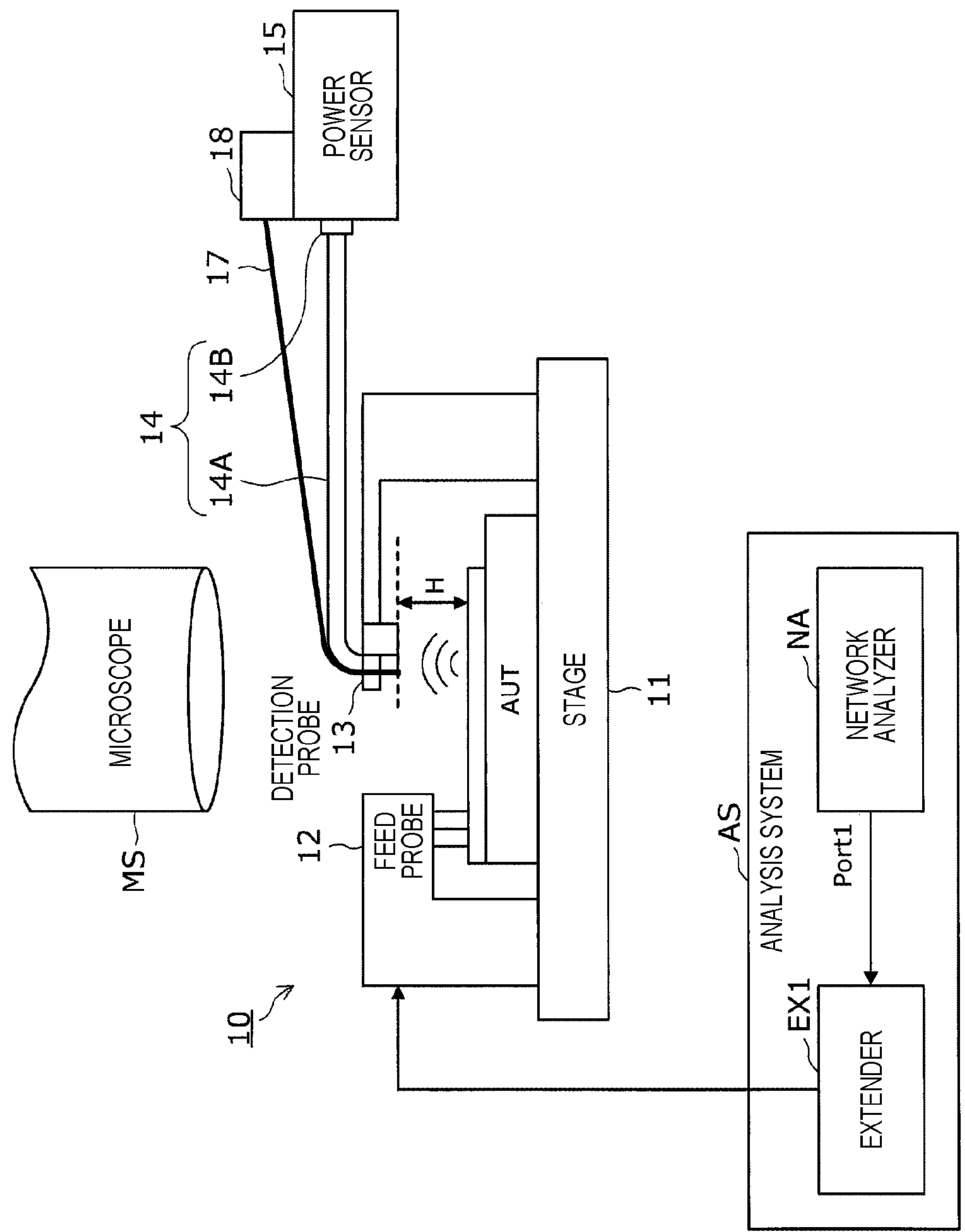
FIG. 4 is an explanatory diagram illustrating a configuration of a radio frequency antenna measurement system according to a second embodiment.

Subsequently, a radio frequency antenna measurement system 10 according to a second embodiment of the present invention will be described with reference to FIG. 4. FIG. 4 is an explanatory diagram illustrating a configuration of a radio frequency antenna measurement system according to the second embodiment.

In the measurement system illustrated in FIG. 1 described above, it is possible to adjust the position of the receiving antenna 14 in two-dimensional directions along the substrate plane of the AUT. However, in a case where a distance (height) X from the AUT to the receiving antenna 14 is measured, a measurement tool such as a caliper or a measure is used and visual check is finally relied on, and it is difficult to reduce the measurement error of the distance X.

As illustrated in FIG. 4, the present embodiment is configured to measure the distance X between the surface of the AUT and the tip of the receiving antenna 14 by connecting an optical fiber 17 to a distance sensor 18 using infrared light, visible light, or the like and disposing the tip of the optical fiber 17 at the tip portion of the receiving antenna 14. Other configurations of the radio frequency antenna measurement system 10 according to the present embodiment are similar to those in FIG. 1 or 3, and a detailed description thereof will be omitted here.

In FIG. 4, an optical signal emitted from the vicinity of the tip of the receiving antenna 14 toward the surface of the AUT via the optical fiber 17 and an optical signal reflected and returned from the substrate of the AUT are received via the optical fiber 17, a time difference between transmission/reception timings of these optical signals is detected by the distance sensor 18, and the distance X between the tip of the receiving antenna and the surface of the AUT is calculated on the basis of the time difference. At the time of measurement, first, the distance is measured in a state where the receiving antenna 14 is in contact with the reference surface, and is calibrated to 0 um (or mm), whereby the height can be flexibly adjusted according to the difference in the substrate thickness and the measurement environment.

Effects of Second Embodiment

In this way, according to the present embodiment, the distance X can be measured by an objective method in which a measurement error such as visual observation is greatly reduced. In addition, by visually displaying the measured value of the distance X on a display, it is expected to improve convenience at the time of measurement. Usually, in antenna measurement in an ultra-high frequency band of millimeter waves or more, a significant loss due to distance attenuation occurs due to a change in a transmission/reception distance in an um order. As in the present embodiment, it is possible to measure an appropriate antenna gain by using a measurement method that is objective and has a high resolution of the um order or less. Therefore, it is possible to appropriately measure radiation characteristics such as gain and radiation patterns regarding an on-chip radio frequency antenna in an ultra-high frequency band with high accuracy.

Third Embodiment

Figure 5:
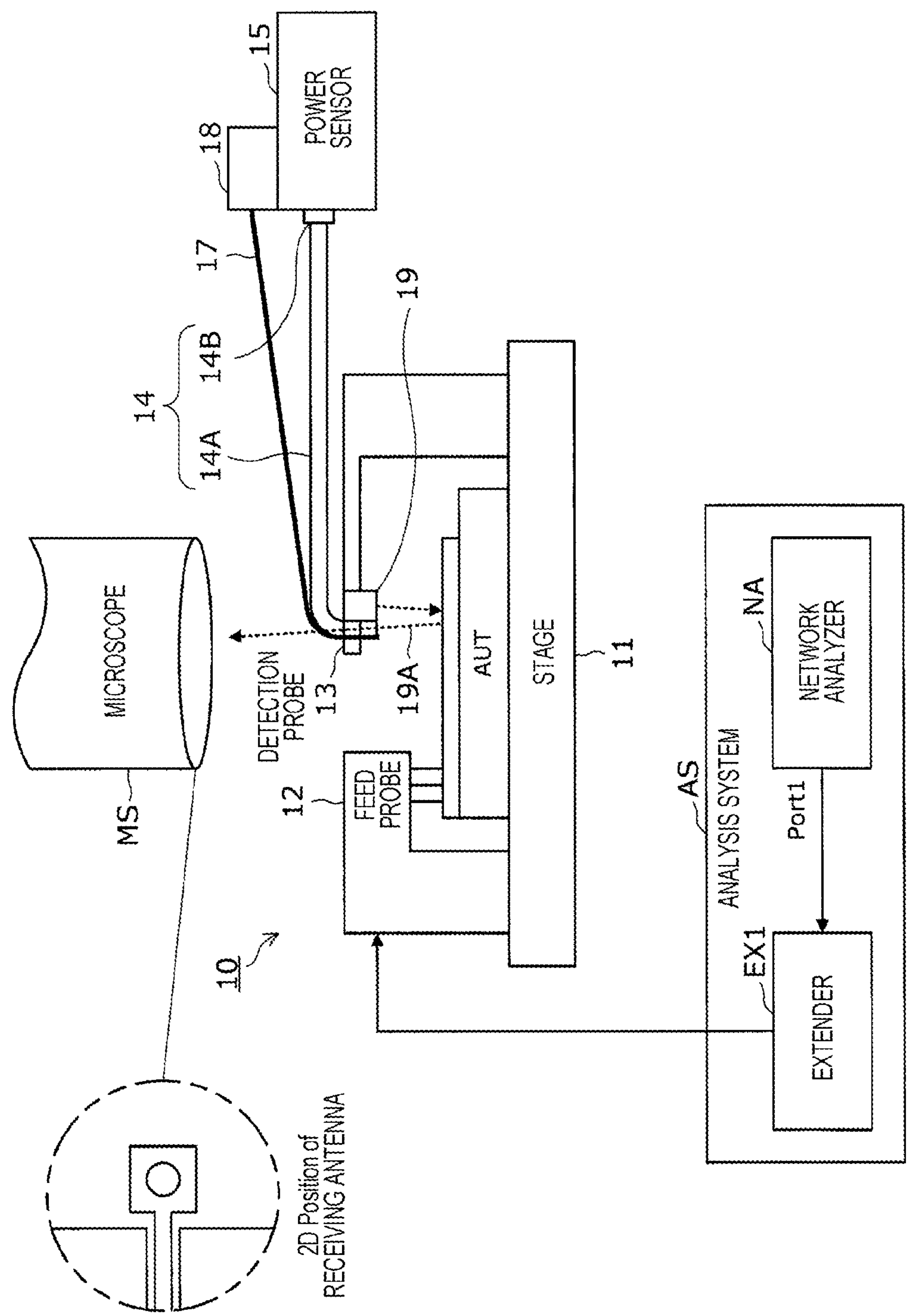
FIG. 5 is an explanatory diagram illustrating a configuration of a radio frequency antenna measurement system according to a third embodiment.

Subsequently, a radio frequency antenna measurement system 10 according to a third embodiment of the present invention will be described with reference to FIG. 5. FIG. 5 is an explanatory diagram illustrating a configuration of a radio frequency antenna measurement system according to the third embodiment.

In the measurement system illustrated in FIGS. 1, 3, and 4 described above, the position of the receiving antenna 14 in the two-dimensional directions along the substrate plane of the AUT is adjusted while being checked by the microscope MS, similarly to the feed probe 12. However, at the time of measurement, a distance in the height direction from the feed probe 12 occurs on the mm order, and the microscope MS is out of focus, and there is a concern that position information between the AUT and the receiving antenna 14 cannot be accurately obtained. Therefore, as a practical means, estimation is performed visually from the position of the shadow of the receiving antenna 14 in a state where the substrate of the AUT is focused.

As illustrated in FIG. 5, the present embodiment is configured to install a laser pointer 19 in the vicinity of the tip of the receiving antenna 14, and to emit a laser beam 19A from the laser pointer 19 toward the AUT. Thereby, the laser beam 19A emitted from the laser pointer 19, reflected by the substrate of the AUT, and returned can be checked by the microscope MS, and the position of the receiving antenna 14 in the two-dimensional directions along the substrate plane of the AUT can be estimated with high accuracy. Other configurations of the radio frequency antenna measurement system 10 according to the present embodiment are similar to those in FIG. 1, 3, or 4, and a detailed description thereof will be omitted here.

The condensing degree (range of two-dimensional spread) and intensity required for the laser beam 19A checked by the microscope MS vary depending on the measurement sample. Therefore, the laser beam 19A may be used differently, such as a laser having a relatively small intensity with a narrow beam when the scale of the measurement sample is small and a laser having a relatively large intensity with a relatively wide beam when the scale of the measurement sample is large. Such use of the laser beam 19A can be realized by replacing a lens attached to the tip of the laser pointer 19 for each use.

Effects of Third Embodiment

In this way, according to the present embodiment, the position of the receiving antenna 14 in the two-dimensional directions along the substrate plane of the AUT can be estimated with high accuracy. Therefore, it is possible to appropriately measure radiation characteristics such as gain and radiation patterns regarding an on-chip radio frequency antenna in an ultra-high frequency band with high accuracy.

Extension of Embodiments

Although the present invention has been described with reference to the embodiments, the present invention is not limited to the above embodiments. Various changes that can be understood by those skilled in the art can be made in the configuration and details of the present invention within the scope of the present invention. In addition, each embodiment can be implemented in any combination within a range not contradictory.

REFERENCE SIGNS LIST

10 Radio frequency antenna measurement system
11 Stage
12 Feed probe
13 Detection probe
14 Receiving antenna
14A Waveguide
14B Connector
14C Waveguide-coaxial conversion adapter
14D Curved portion
15 Power sensor
15A Coaxial cable
16 Holding stand
17 Optical fiber
18 Distance sensor
19 Laser pointer
AUT On-chip radio frequency antenna
AS Analysis system
NA Network analyzer
EX1 Extender
MS Microscope.

The invention claimed is:

1. A radio frequency antenna measurement system comprising:

a stage supporting an on-chip radio frequency antenna configured to be measured;

a feed probe configured to feed an input radio frequency signal to the radio frequency antenna;

a receiving antenna configured to receive a radiated radio wave from the radio frequency antenna; and a power sensor configured to measure a radiation characteristic of the radio frequency antenna in response to a reception signal output from the receiving antenna, wherein the receiving antenna includes a waveguide in which a connector for outputting the reception signal to the power sensor is integrally formed at a rear end.

2. The radio frequency antenna measurement system according to claim 1, wherein the connector includes a conversion adapter configured to convert the waveguide into a coaxial cable of the power sensor.

3. The radio frequency antenna measurement system according to claim 2, further comprising a distance sensor configured to emit an optical signal from a tip of the receiving antenna toward a surface of the radio frequency antenna via an optical fiber and configured to receive the optical signal reflected by the surface of the radio frequency antenna via the optical fiber, wherein the distance sensor is configured to calculate a distance between the tip of the receiving antenna and the surface of the radio frequency antenna on a basis of a time difference between transmission timing of emitting the optical signal and reception timing of receiving the optical signal.

4. The radio frequency antenna measurement system according to claim 2, further comprising a laser pointer adjacent to a tip of the receiving antenna and configured to emit a laser beam toward a surface of the radio frequency antenna, wherein a position of the receiving antenna in two-dimensional directions along a substrate plane of the radio frequency antenna is estimated from the laser beam reflected by the surface of the radio frequency antenna.

5. The radio frequency antenna measurement system according to claim 2, wherein the receiving antenna has a curved portion adjacent to the connector, and a position where the radiated radio wave is received is held so as to be changeable about a central axis of the conversion adapter.

6. The radio frequency antenna measurement system according to claim 5, further comprising a distance sensor configured to emit an optical signal from a tip of the receiving antenna toward a surface of the radio frequency antenna via an optical fiber and configured to receive the optical signal reflected by the surface of the radio frequency antenna via the optical fiber, wherein the distance sensor is configured to calculate a distance between the tip of the receiving antenna and the surface of the radio frequency antenna on a basis of a time difference between transmission timing of emitting the optical signal and reception timing of receiving the optical signal.

7. The radio frequency antenna measurement system according to claim 5, further comprising a laser pointer adjacent to a tip of the receiving antenna and configured to emit a laser beam toward a surface of the radio frequency antenna, wherein a position of the receiving antenna in two-dimensional directions along a substrate plane of the radio frequency antenna is estimated from the laser beam reflected by the surface of the radio frequency antenna.

8. The radio frequency antenna measurement system according to claim 1, further comprising a distance sensor configured to emit an optical signal from a tip of the receiving antenna toward a surface of the radio frequency antenna via an optical fiber and configured to receive the optical signal reflected by the surface of the radio frequency antenna via the optical fiber, wherein the distance sensor is configured to calculate a distance between the tip of the receiving antenna and the surface of the radio frequency antenna on a basis of a time difference between transmission timing of emitting the optical signal and reception timing of receiving the optical signal.

9. The radio frequency antenna measurement system according to claim 1, further comprising a laser pointer adjacent to a tip of the receiving antenna and configured to emit a laser beam toward a surface of the radio frequency antenna, wherein a position of the receiving antenna in two-dimensional directions along a substrate plane of the radio frequency antenna is estimated from the laser beam reflected by the surface of the radio frequency antenna.

10. A method of operating a radio frequency antenna measurement system, the method comprising:

supporting, by a stage, an on-chip radio frequency antenna to be measured;

feeding, by a feed probe, an input radio frequency signal to the radio frequency antenna;

receiving, by a receiving antenna, a radiated radio wave from the radio frequency antenna; and measuring, by a power sensor, a radiation characteristic of the radio frequency antenna in response to a reception signal output from the receiving antenna, wherein the receiving antenna includes a waveguide in which a connector for outputting the reception signal to the power sensor is integrally formed.

11. The method according to claim 10, wherein the connector includes a conversion adapter configured to convert the waveguide into a coaxial cable of the power sensor.

12. The method according to claim 11, further comprising:

emitting, by a distance sensor, an optical signal from a tip of the receiving antenna toward a surface of the radio frequency antenna via an optical fiber;

receiving, by the distance sensor, the optical signal reflected by the surface of the radio frequency antenna via the optical fiber; and calculating, by the distance sensor, a distance between the tip of the receiving antenna and the surface of the radio frequency antenna on a basis of a time difference between transmission timing of emitting the optical signal and reception timing of receiving the optical signal.

13. The method according to claim 11, further comprising:

emitting, by a laser pointer, a laser beam toward a surface of the radio frequency antenna, wherein the laser pointer is disposed adjacent to a tip of the receiving antenna; and estimating a position of the receiving antenna in two-dimensional directions along a substrate plane of the radio frequency antenna from the laser beam reflected by the surface of the radio frequency antenna.

14. The method according to claim 11, wherein the receiving antenna has a curved portion adjacent to the connector, and a position where the radiated radio wave is received is held so as to be changeable about a central axis of the conversion adapter.

15. The method according to claim 14, further comprising:

emitting, by a distance sensor, an optical signal from a tip of the receiving antenna toward a surface of the radio frequency antenna via an optical fiber;

receiving, by the distance sensor, the optical signal reflected by the surface of the radio frequency antenna via the optical fiber; and calculating, by the distance sensor, a distance between the tip of the receiving antenna and the surface of the radio frequency antenna on a basis of a time difference between transmission timing of emitting the optical signal and reception timing of receiving the optical signal.

16. The method according to claim 14, further comprising:

emitting, by a laser pointer, a laser beam toward a surface of the radio frequency antenna, wherein the laser pointer is disposed adjacent to a tip of the receiving antenna; and estimating a position of the receiving antenna in two-dimensional directions along a substrate plane of the radio frequency antenna from the laser beam reflected by the surface of the radio frequency antenna.

17. The method according to claim 10, further comprising:

emitting, by a distance sensor, an optical signal from a tip of the receiving antenna toward a surface of the radio frequency antenna via an optical fiber;

receiving, by the distance sensor, the optical signal reflected by the surface of the radio frequency antenna via the optical fiber; and calculating, by the distance sensor, a distance between the tip of the receiving antenna and the surface of the radio frequency antenna on a basis of a time difference between transmission timing of emitting the optical signal and reception timing of receiving the optical signal.

18. The method according to claim 10, further comprising:

emitting, by a laser pointer, a laser beam toward a surface of the radio frequency antenna, wherein the laser pointer is disposed adjacent to a tip of the receiving antenna; and estimating a position of the receiving antenna in two-dimensional directions along a substrate plane of the radio frequency antenna from the laser beam reflected by the surface of the radio frequency antenna.

* * * * *